United States Patent [19]  [11] Patent Number: 4,983,650
Sasaki  [45] Date of Patent: Jan. 8, 1991

[54] FINE POLISHING COMPOSITION FOR WAFERS

[75] Inventor: Shigeo Sasaki, Yokkaichi, Japan

[73] Assignee: Monsanto Japan Limited, Tokyo, Japan

[21] Appl. No.: 290,367

[22] Filed: Dec. 29, 1988

[30] Foreign Application Priority Data

Dec. 29, 1987 [JP] Japan ................................. 62-333027
Jun. 27, 1988 [JP] Japan ................................. 63-156691

[51] Int. Cl.$^5$ .......................... C08K 3/36; C08K 5/20; C08K 7/10; C08G 59/52
[52] U.S. Cl. ......................................... 524/27; 524/30; 524/35; 524/47; 524/442; 523/443; 527/312
[58] Field of Search ..................... 523/443; 524/27, 30, 524/35, 47, 442; 527/312

[56] References Cited

U.S. PATENT DOCUMENTS 4,260,396  4/1981  Glemza ................................. 51/298

Primary Examiner—Merrell C. Cashion, Jr.
Assistant Examiner—Carlos Azpuru
Attorney, Agent, or Firm—Oblon, Spivak, McClelland, Maier & Neustadt

[57] ABSTRACT

A fine polishing composition for wafers, comprising water, particulate amorphous silica and a polysaccharide polymer graft-polymerized with acrylamide alone or together with at least one vinyl monomer selected from the group consisting of acrylic acid, methacrylic acid and styrenesulfonic acid, and adjusted with an alkaline substance to a pH of from 8 to 12.

8 Claims, No Drawings

FINE POLISHING COMPOSITION FOR WAFERS

The present invention relates to a polishing composition to smooth the surface of wafers which are widely used as supporting crystals for integrated circuits. More particularly, it relates to a fine polishing composition to smooth the surface of wafers to remove irregularities exceeding 10 mμm.

Wafers widely used as supporting crystals for integrated circuits, are usually prepared by slicing an ingot of silicon or germanium crystal, and their surface is then polished to form a flat surface free from irregularities as far as possible before formation of integrated circuit thereon. If irregularities are present on the wafer surface, it is difficult to form a circuit pattern precisely and finely on the surface, and such irregularities tend to lead to non-uniformity of the electric characteristics of the wafers.

Heretofore, various polishing agents have been proposed to polish the surface of such wafers.

For example, U.S. Pat. No. 3,170,273 discloses a silica sol having a silica concentration of from 2 to 50% by weight and a silica gel having a silica concentration of from 2 to 100%, as polishing agents. U.S. Pat. No. 3,328,141 discloses that an alkaline compound is added to such polishing agents to adjust the pH to a level of from 10.5 to 12.5, whereby the polishing rate can be increased. However, the wafer surface polished with these polishing agents, still has irregularities of from 5 to 50 mμm when observed by a differential interference microscope and thus is not fully satisfactory.

Japanese Examined Patent Publication No. 9910/1978 discloses a polishing agent comprising quartz, a silicate and a hexafluorosilicate, which further contains a monovalent alcohol having from 3 to 5 carbon atoms and a polyvinyl alcohol. However, no adequately satisfactorily polished surface can be obtained even with this polishing agent. Besides, such a polishing agent containing an alcohol has a difficulty in the storage stability for a long period of time.

Further, U.S. Pat. No. 4,260,396 discloses a polishing agent containing water-soluble carboxymethylene gum or xanthane gum. However, such a polishing agent has a drawback that it takes a long polishing time to obtain a smooth polished surface and requires a long period of time for so-called rinse polishing conducted after polishing while supplying washing water. Further, it has a drawback that microorganisms utilizing xanthane gum as a nutrient source are likely to grow in the polishing agent, whereby it is difficult to maintain the storage stability for a long period of time.

It is an object of the present invention to overcome such drawbacks inherent to the conventional polishing compositions and to accomplish the following objectives:

(1) To provide a polishing agent which is, when used for polishing a wafer, capable of providing a polished surface having no irregularities observable even by a differential interference microscope.
(2) To provide a polishing agent which requires only a short period of time for providing a smooth surface.
(3) To provide a polishing agent which requires only a short period of time for rinse polishing.
(4) To provide a polishing agent having good storage stability for a long period of time.

The present inventors have conducted extensive research to accomplish the above objectives and as a result, have found it possible to accomplish such objectives by providing a composition having a polysaccharide polymer graft-polymerized with a certain specific vinyl monomer incorporated in a slurry containing particulate amorphous silica and having the pH adjusted to a specific range with an alkaline substance, or by providing a composition obtained by incorporating a certain specific water-soluble salt to the above composition. The present invention has been accomplished on the basis of these discoveries. According to a first aspect, the present invention provides a fine polishing composition for wafers, comprising water, particulate amorphous silica and a polysaccharide polymer graft-polymerized with acrylamide alone or together with at least one vinyl monomer selected from the group consisting of acrylic acid, methacrylic acid and styrenesulfonic acid, and adjusted with an alkaline substance to a pH of from 8 to 12.

According to a second aspect, the present invention provides a fine polishing composition for wafers, comprising water, particulate amorphous silica, a polysaccharide polymer graft-polymerized with acrylamide alone or together with at least one vinyl monomer selected from the group consisting of acrylic acid, methacrylic acid and styrenesulfonic acid, and a water-soluble salt, and adjusted with an alkaline substance to a pH of from 8 to 12.

Now, the present invention will be described in detail with reference to the preferred embodiments.

As the particulate amorphous silica to be used in the present invention, colloidal silica sol or silica powder may be mentioned. It may be used in the form of an aqueous slurry wherein colloidal silica sol or silica powder is suspended in water, or in such a form that is capable of forming a slurry when added to water.

Such particulate amorphous silica usually has an average particle size within a range of from 5 mμm to 10 μm. If the average particle size is less than 5 mμm, the proportion of the silicic acid monomer or oligomer in the particles tends to be large, and if such particles are used for polishing, the silicic monomer or oligomer tends to deposit in the form of silica on the wafer surface, such being undesirable. If the average particle size exceeds 10 μm, the wafer surface tends to be susceptible to scratching.

In the present invention, the average particle size means an average particle size of independent particles when such particles are present in a separated state without coagulation, or an average particle size of coagulates when particles are present in a coagulated state.

The content of the particulate amorphous silica in the fine polishing composition for wafers according to the present invention, is usually at least 0.1% by weight. If the content is too small, no adequate effects will be obtained.

In the present invention, as the polysaccharide polymer, gua gum or xanthane gum may, for example, be mentioned. Gua gum is meant for viscous galactomannan contained in the albumen of seeds of gua which is a leguminous plant, and xanthane gum is meant for a polymer polysaccharide obtained by pure cultivation and fermentation of *Xanthomonas campestris*.

The fine polishing composition for wafers according to the present invention, contains a graft-polymerized polysaccharide polymer obtained by graft-polymerizing to the above-mentioned polysaccharide polymer an acrylamide monomer or a comonomer mixture composed of an acrylamide monomer and at least one vinyl monomer selected from the group consisting of acrylic acid, methacrylic acid and styrenesulfonic acid.

By the graft-polymerization of the acrylamide monomer alone or together with other specific vinyl monomer to the above-mentioned polysaccharide polymer, it is possible to obtain a graft-polymerized polysaccharide polymer having high resistance against biochemical decomposition due to microorganisms without sacrificing the water-solubility of the polysaccharide polymer. The graft polymerization reaction of the polysaccharide polymer with the acrylamide monomer alone or together with other specific vinyl monomer proceeds efficiently and is therefore advantageous from the industrial point of view.

Further, the polishing composition containing such a graft-polymerized polysaccharide polymer is far superior in drag reduction effect to the polishing composition containing the non-graft polymerized polysaccharide polymer. The drag reduction effect is an effect whereby a turbulent flow hardly takes place even under a condition where the Reynolds number of the fluid is high. The drag reduction effect of the polishing composition of the present invention is high. This means that even when used for polishing under high pressure, the polishing composition maintains laminar flow and hardly forms a turbulent flow.

Acrylamide may be graft-polymerized to the polysaccharide polymer in accordance with a method described in detail, for example, in Journal of Applied Polymer Science Vol. 30, 4013–4018 (1985) and ditto, Vol. 32, 6163–6176 (1986). For example, when acrylamide is graft-polymerized to gua gum or xanthane gum, from 1 mmol to 1 mol of acrylamide and from 1 μmol to 10 mmol of a polymerization initiator are added per g of gua gum or xanthane gum to an aqueous solution containing from 0.01 to 2.0% by weight of gua gum or xanthane gum, and the mixture is reacted at a temperature of from 0° to 100° C. in air or in the presence of an inert gas. As the polymerization initiator, a cerium ion type radical is preferably employed. Further, gua gum or xanthane gum is preferably of high purity.

The graft-polymerization of the above vinyl monomer and acrylamide to the polysaccharide polymer may be conducted as follows.

For example, when the above-mentioned vinyl monomer and acrylamide are graft-polymerized to gua gum or xanthane gum, from 1 mmol to 1 mol of the above vinyl monomer, from 1 mmol to 1 mol of acrylamide and from 1 μmol to 10 mmol of a polymerization initiator are added per g of gua gum or xanthane gum to an aqueous solution containing from 0.01 to 2.0% by weight of gua gum or xanthane gum, and the mixture is reacted at a temperature of from 0° to 100° C in air or in the presence of an inert gas. As the polymerization initiator, a cerium ion type radical is preferably employed as in the above-mentioned case. Further, gua gum and xanthane gum is preferably of high purity as in the above case.

The content of the graft-polymerized polysaccharide polymer in the fine polishing composition for wafers according to the present invention, is usually at least 1 ppm, preferably from 10 to 1,000 ppm. When a wafer is polished with the polishing composition having a graft-polymerized polysaccharide polymer content within this range, a laminar flow will be formed in the direction of polishing between the polishing cloth and the wafer surface, whereby the wafer surface can be made smoother. If the content is less than 1 ppm, such a laminar flow tends to be hardly formed. On the other hand, if the content exceeds 1,000 ppm, a turbulent flow is likely to be formed, such being undesirable.

The fine polishing composition for wafers according to the present invention is adjusted with an alkaline substance to a pH of from 8 to 12, preferably from 9 to 10, to maintain the silica sol under a stabilized condition.

As the alkaline substance, an alkali metal hydroxide, an amine or ammonia may be used. As the alkali metal hydroxide, potassium hydroxide, sodium hydroxide, rubidium hydroxide or cesium hydroxide may be mentioned. Among them, potassium hydroxide and, sodium hydroxide are preferred. The amine includes triethylamine, triethanolamine, monoethanolamine, diisopropanolamine, ethylenediamine, tetraethylpentamine, triethylpentamine, diethylenetriamine and hexamethylenediamine. Among them, ethylenediamine is preferred.

According to the second aspect of the present invention, the fine polishing composition for wafers further contains a water soluble salt in addition to the above described components. The water soluble salt has a function to reduce the thickness of the hydrated layer on the surface of silica particles in the fine polishing composition in the form of a slurry, whereby the dynamic action of the silica particles over the wafer during polishing operation of the wafer with the polishing composition, will increase, the mechanical polishing ability will increase, and the polishing efficiency will be improved.

Specific examples of the water-soluble salt include compounds composed of various combinations of a cation selected from the group consisting of lithium ion, sodium ion, potassium ion, cesium ion and ammonium ion and an anion selected from the group consisting of fluorine ion, chlorine ion, bromine ion, iodine ion, sulfuric acid ion, nitric acid ion, perchloric acid ion, carbonic acid ion, formic acid ion, acetic acid ion, acrylic acid ion and oxalic acid ion. Such compounds may be used alone or in combination as a mixture of two or more. Among them, potassium chloride and potassium perchlorate are preferred which have a high ionization degree in the polishing composition in the from of a slurry and the cation of which has a large atomic radius.

The content of the water-soluble salt in the fine polishing composition for wafers according to the second aspect of the present invention, is usually at least 20 ppm. By the incorporation of the water-soluble salt, it is possible to reduce the thickness of the hydrated layer formed on the surface of silica particles. If the content is less than 20 ppm, no adequate effects can be obtained.

The present invention provides the following remarkable effects and its industrial value for practical application is very high.

(1) When a wafer is polished with the fine polishing composition of the present invention, the above-mentioned graft-polymerized polysaccharide polymer in the slurry composition improves the drag reduction effect so that a laminar flow is formed between the polishing cloth and the wafer, while suppressing the formation of a turbulent flow. Accordingly, the polished wafer surface presents a smooth flat polished surface with no irregularities to be observed even when inspected with a differential interference microscope.

(2) The fine polishing composition of the present invention has a good storage stability for a long period of time, since the polysaccharide polymer graft-polymerized with an acrylamide monomer alone or together with other specific vinyl monomer, has high resistance against biochemical decomposition due to microorganisms.

(3) The fine polishing composition according to the second aspect of the present invention, provides not only the above-mentioned effects (1) and (2), but also a function to reduce the thickness of the hydrated layer on the surface of silica particles in the fine polishing composition in the form of a slurry, by virtue of the water-soluble salt, whereby the dynamic action of the silica particles on the wafer during the polishing operation of the wafer increases, and the mechanical polishing ability increases and the polishing efficiency is improved.

Now, the present invention will be described in further detail with reference to Examples and Comparative Examples. However, it should be understood that the present invention is by no means restricted by such specific Examples.

EXAMPLE A-1

(1) Preparation of gua gum graft-polymerized with acrylamide

Gua gum having a high molecular weight (Mayprodol 120, tradename, manufactured by Sansho K.K.) was dissolved in water to obtain a 0.5 wt % aqueous solution. This solution was purified by a filtration method and an alcohol extruction method in the following manner. Firstly, coarse impurities in the gua gum aqueous solution were removed by filtration by means of a mesh filter having a pore size of from 1 to 10 μm. Gua gum does not dissolve in an alcohol. Therefore, the gua gum aqueous solution was poured into an alcohol to elute alcohol-soluble impurities, and the precipitate was recovered. The precipitate was dried and dissolved again in water to obtain an aqueous gua gum solution having a predetermined concentration i.e. a 1 wt % gua gum aqueous solution in this Example.

To 1 liter of the 1 wt % aqueous solution thus obtained, 0.5 mol of acrylamide was added, and the mixture was stirred while bubbling nitrogen. To this mixture, 0.3 mmol of ammonium cerium nitrate was added as a polymerization initiator, and the mixture was reacted at room temperature for 24 hours under stirring to obtain gua gum graft-polymerized with acrylamide.

The graft polymerization reaction may be conducted under an atmosphere of air by adding the polymerization initiator solution in an excess amount of about 10 mmol, or may be conducted by stirring the mixture for about one hour and leaving it to stand still thereafter.

(2) Preparation of a polishing composition

The 1 wt % aqueous solution of gua gum graft-polymerized with acrylamide obtained by the process of step (1) was added by an amount of 200 ppm as gua gum to an aqueous colloidal silica solution containing 2% by weight of silica having an average particle size of 70 mμm. To the aqueous solution thus obtained, dimethylamine was added in an amount of 0.6% by weight to adjust the pH to a level of from 9 to 10 to obtain a fine polishing composition for wafers.

(3) Storage test of the polishing composition

The polishing composition obtained in step (2) was stored. Periodically, this composition was permitted to flow under a pressure of 4 kg/cm² in a capillary tube having an inner diameter of 0.5 mm and a length of 50 cm, and the pressures at the inlet and the outlet of the capillary tube were measured to determine the period of time until the pressure loss increases to a level of 0.4 time beyond the pressure loss of water. The results are shown in Table 1.

(4) Fine polishing test of a wafer

By a polishing machine SPAW 36, manufactured by Speed Fam, a silicon wafer was polished supplying the above-mentioned polishing composition at a rate of 1 l/min and using a soft sweade type polishing cloth. The polishing pressure was 100 g/cm², and the relative speed of the polishing cloth to the wafer was 1 m/sec. The temperature of the polishing cloth during the polishing operation was 40° C.

The necessary polishing time for making smooth surface of wafer was measured. The determination for smoothness was evaluated by the observation of the wafer surface during the polishing operation by means of a differential interference microscope. The results are shown in Table 1.

After the polishing by the polishing machine, rinse polishing was conducted while supplying water instead of the above polishing composition to remove silica and the polysaccharide polymer from the wafer surface. The time required for the rinse polishing was measured. The completion of the rinse polishing was determined by the observation of the wafer surface by means of a differential interference microscope. The results are shown in Table 1.

EXAMPLE A-2

(1) Preparation of xanthane gum graft-polymerized with acrylamide

Xanthane gum having a high molecular weight (Kelzan F, tradename, manufactured by Sansho K.K.) was dissolved in water to obtain a 0.5 wt % aqueous solution.

This solution was purified in the same manner as in Example A-1(1), and the graft-polymerization of acrylamide was conducted also in the same manner to obtain xanthane gum graft-polymerization with acrylamide.

(2) Preparation of a polishing composition

The 1 wt % aqueous solution of xanthane gum graft-polymerized with acrylamide obtained in step (1) was added by an amount of 200 ppm as xanthane gum to an aqueous colloidal silica solution containing 2% by weight of silica having an average particle size of 70 mμm. To the aqueous solution thus obtained, dimethylamine was added by an amount of 0.6% by weight to adjust the pH to a level of from 9 to 10 to obtain a fine polishing composition for wafers.

(3) Storage test of the polishing composition

The evaluation was conducted in the same manner as in Example A-1(3). The results are shown in Table 1.

(4) Fine polishing test of a wafer

The test was conducted in the same manner as in Example A 1(4). The results are shown in Table 1.

COMPARATIVE EXAMPLE A 1

(1) Preparation of a polishing composition

A polishing composition was prepared in the same manner as in Example A-1 except that gua gum (Mayprodol 120, manufactured by Sansho K. K.) purified in the same manner as in Example A-1(1) was used instead of the gua gum graft-polymerized with acrylamide, in Example A-1 (2).

(2) Storage test of the polishing composition

The evaluation was conducted in the same manner as in Example A-1(3). The results are shown in Table 1.

(3) Fine polishing test of a wafer

The evaluation was conducted in the same manner as in Example A-1(4). The results are shown in Table 1.

COMPARATIVE EXAMPLE A-2

(1) Preparation of a polishing composition

A polishing composition was prepared in the same manner as in Example A-2 except that xanthane gum (Kelzan F, manufactured by Sansho K.K.) purified in the same manner as in Example A-2(1) was used instead of the xanthane gum graft-polymerized with acrylamide, in Example A-2(2).

(2) Storage test of the polishing composition

The evaluation was conducted in the same manner as in Example A-1(3). The results are shown in Table 1.

(3) Fine polishing test of a wafer

The evaluation was conducted in the same manner as in Example A-1(4). The results are shown in Table 1.

stored even for a short period of time and thus have poor storage stability.

4. When the polishing is conducted by using the polishing compositions of the Comparative Examples, the fine polishing time and the rinse polishing time are both longer than the corresponding times in the Examples of the present invention.

EXAMPLE B-1

(1) Preparation of gua gum graft-polymerized with acrylic acid and acrylamide

Gua gum having a high molecular weight (Mayprogutt 120, tradename, Sansho K.K.) was dissolved in water to obtain a 0.5 wt % aqueous solution. This solution was purified by a filtration method and an alcohol extraction method in the following manner.

Firstly, coarse impurities in the gua gum aqueous solution were removed by filtration by means of a mesh filter having a pore size of from 1 to 10 μm. Gua gum is not soluble in an alcohol. Therefore, the gua gum aqueous solution was poured into an alcohol to elute alcohol-soluble impurities, and the precipitate was recovered. This precipitate was dried and then dissolved again in water to obtain an aqueous gua gum solution having a predetermined concentration, i.e. a 1 wt % gua gum aqueous solution in this Example.

To 1 liter of the 1 wt % aqueous solution thus obtained, 0.5 mol of acrylamide and 0.05 mol of acrylic acid were added, and the mixture was stirred while bubbling nitrogen. To this mixture, 0.3 mmol of ammo-

TABLE 1

| Items | Examples | | Comparative Examples | |
|---|---|---|---|---|
| | A-1 | A-2 | A-1 | A-2 |
| Particulate amorphous silica | | | | |
| Type | Colloidal silica | Colloidal silica | Colloidal silica | Colloidal silica |
| Average particle size (mμm) | 70 | 70 | 70 | 70 |
| Content (wt %) in the composition | 2.0 | 2.0 | 2.0 | 2.0 |
| Polysaccharide polymer | | | | |
| Type | Gua gum | Xanthane gum | Gua gum | Xanthane gum |
| Graft monomer component | AM*2 | AM*2 | — | — |
| Content (ppm) in the composition*1 | 200 | 200 | 200 | 200 |
| Alkaline substance, pH | | | | |
| Type | Dimethylamine | Dimethylamine | Dimethylamine | Dimethylamine |
| pH of the composition | 9–10 | 9–10 | 9–10 | 9–10 |
| Storage test of the composition Period of time until the pressure loss increases to a level of 0.4 time beyond that of water | More than 1 month | More than 1 month | Less than 1 week | Less than 1 week |
| Fine polishing test of a wafer | | | | |
| Polishing time (min) required to obtain a smooth surface | 5 | 5 | 10 | 10 |
| Rinse polishing time (min) | 0.5 | 0.5 | 1 | 1 |

*1 The content is expressed by the concentration of gua gum (Example A-1) or xanthane gum (Example A-2).
*2 AM means acrylamide.

The followings are evident from Table 1:

1. The polishing compositions of the present invention do not lose the drag reduction effects even when stored for a long period of time and thus have excellent storage stability.

2. When the polishing is conducted by using the polishing compositions of the present invention, the fine polishing time is short, and the rinse polishing time is also short, and thus the polishing compositions of the present invention are excellent as polishing agents.

3. Whereas, the polishing compositions of the Comparative Examples lose the drag reduction effects when nium cerium nitrate was added as a polymerization initiator. The mixture was reacted at room temperature for 24 hours under stirring to obtain gua gum graft-polymerized with acrylamide and acrylic acid.

(2) Preparation of a polishing composition

The 1 wt % aqueous solution of gua gum graft-polymerized with acrylamide and acrylic acid obtained by the process of step (1), was added in an amount of 75 ppm as gua gum to an aqueous colloidal silica solution containing 0.7% by weight of silica having an average particle size of 70 m$\mu$m. To the aqueous solution thus obtianed, ammonia was added in an amount of 0.06% by weight to adjust the pH to a level of from 9 to 10 to obtain a fine polishing composition for wafers.

(3) Storage test of the polishing composition

The composition obtained in step (2) was stored at room temperature and periodically evaluated in the same manner as in Example A-1(3). The results are shown in Table 2.

(4) Fine polishing test of a wafer

The evaluation was conducted in the-same manner as in Example A-1(4) except that the relative speed of the polishing cloth to the wafer was changed to 1.4 m/sec. The results are shown in Table 2.

EXAMPLE B-2

(1) preparation of gua gum graft-polymerized with methacrylic acid and acrylamide Gua gum having a high molecular weight (May-progutt 120, tradename, manufactured by Sansho K.K.) was dissolved in water to obtain a 0.5 wt % aqueous solution. This solution was purified in the same manner as in Example B-1(1) and dissovled in water to obtain a 1 wt % gua gum aqueous solution. To 1 liter of the 1 wt % aqueous solution thus obtained, 0.5 mol of acrylamide and 0.05 mol of methacrylic acid were added, and the mixture was stirred while bubbling nitrogen. To this mixure, 0.3 mmol of ammonium cerium nitrate was added as a polymerization initiator. The mixture was reacted at room temperature for 24 hours under stirring to obtain gua gum graft-polymerized with acrylamide and methacrylic acid.

(2) Preparation of a polishing composition

The 1 wt % aqueous solution of gua gum graft-polymerized with acrylamide and methacrylic acid obtained in step (1), was added by an amount of 75 ppm as gua gum to an aqueous colloidal silica solution containing 0.7% of silica having an average particle size of 70 m$\mu$m. To the aqueous solution thus obtained, ammonia was added in an amount of 0.06% by weight to adjust the pH to a level of from 9 to 10 to obtain a fine polishing composition for wafers.

(3) Storage test of the polishing composition

The evaluation was conducted in the same manner as in Example A1(3). The results are shown in Table 2.

(4) Fine polishing test of a wafer

The evaluation was conducted in the same manner as in Example B-1(4). The results are shown in Table 2.

COMPARATIVE EXAMPLE B 1

(1) Preparation of a polishing composition

A polishing composition was prepared in the same manner as in Example B-1(2) except that gua gum purified in the same manner as in Example B-1(1) i.e. non-grafted gua gum, was used instead of the gua gum graft-polymerized with acrylamide and acrylic acid, in Example B-1(2), the amount of the gua gum was changed to 200 ppm and the content of silica was changed to 2% by weight.

(2) Storage test of the polishing composition

The evaluation was conducted in the same as in Example B-1(3). The results are shown in Table 2.

(3) Fine polishing test of a wafer

The evaluation was conducted in the same manner as in Example B-1(4). The results are shown in Table 2.

COMPARATIVE EXAMPLE B-2

(1) Preparation of a polishing composition

A polishing composition was prepared in the same manner as in Example B-1(2) except that gua gum purified in the same manner as in Example B-1(1) i.e. non-grafted gua gum, was used instead of the gua gum graft-polymerized with acrylamide and acrylic acid in Example B-1(2), the amount of the gua gum was changed to 75 ppm, and the content of silica was changed to 2% by weight.

(2) Storage test of the polishing composition

The evaluation was conducted in the same manner as in Example B-1(3). The results are shown in Table 2.

(3) Fine polishing test of a wafer

The evaluation was conducted in the same manner as in Example A-1(4). The results are shown in Table 2.

COMPARATIVE EXAMPLE B-3

(1) Preparation of a polishing composition

A polishing composition was prepared in the same manner as in Example B-1(2) except that gua gum purified in the same manner as in Example B-1(1) i.e. non-grafted gua gum, was used instead of the gua gum graft-polymerized with acrylamide and acrylic acid in Example B-1(2), the amount of gua gum was changed to 200 ppm, and the content of silica was changed to 0.7% by weight.

(2) Storage test of the polishing composition

The evaluation was conducted in the same manner as in Example B-1(3). The results are shown in Table 2.

(3) Fine polishing test of a wafer

The evaluation was conducted in the same manner as in Example A-1(4). The results are shown in Table 2.

TABLE 2

| Items | Examples | | Comparative Examples | | |
|---|---|---|---|---|---|
| | B-1 | B-2 | B-1 | B-2 | B-3 |
| Particulate amorphous silica | | | | | |
| Type | Colloidal silica | Colloidal silica | Colloidal silica | Colloidal silica | Colloidal silica |
| Average particle size (m$\mu$m) | 70 | 70 | 70 | 70 | 70 |
| Content (wt %) in the composition | 0.7 | 0.7 | 0.7 | 2.0 | 0.7 |
| Polysaccharide polymer | | | | | |

TABLE 2-continued

| Items | Examples | | Comparative Examples | | |
|---|---|---|---|---|---|
| | B-1 | B-2 | B-1 | B-2 | B-3 |
| Type Graft monomer component | Gua gum AM/AA*4 | Gua gum AM/MA*5 | Gua gum — | Gua gum — | Gua gum — |
| Content (ppm) in the composition*3 | 75 | 75 | 75 | 75 | 200 |
| Alkaline substance, pH | | | | | |
| Type | Ammonia | Ammonia | Ammonia | Ammonia | Ammonia |
| pH of the composition | 9–10 | 9–10 | 9–10 | 9–10 | 9–10 |
| Storage test of the composition Period of time until the pressure loss increases to a level of 0.4 time beyond that of water | More than 1 month | More than 1 month | Less than 1 week | Less than 1 day | Less than 1 week |
| Fine polishing test of a wafer Polishing time (min) required to obtain a smooth surface | 4 | 4 | 10 | No smooth surface obtained even by polishing for 20 minutes | |

*3 The content is expressed by the concentration of gua gum.
*4 AA means acrylic acid.
*5 MA means methacrylic acid.
*6 The content is expressed by the concentration of gua gum.

The followings are evident from Table 2:

1. The polishing compositions of the present invention do not lose the drag reduction effects even when stored for a long period of time and thus have excellent storage stability.

2. When the polishing is conducted by using the polishing compositions of the present invention, the fine polishing time is short. Thus, the polishing compositions of the present invention are suitable as polishing agents.

3. The silica content and the polymer content in the slurry required to accomplish the fine polishing can be small, such being economical.

4. Whereas, the polishing compositions of the Comparative Examples lose the drag reduction effects when stored even for a short period of time and thus have poor storage stability.

5. When the polishing is conducted by using the polishing compositions of the Comparative Examples, the silica content and the polymer content in the slurry required to accomplish the fine polishing are obliged to be larger than the Examples of the present invention, such being economically disadvantageous.

EXAMPLES C-1 TO C-4 and COMPARATIVE EXAMPLE C-1

To the fine polishing composition for wafers prepared in the same manner as in Example A-1(2) and to the fine polishing composition for wafers prepared in the same manner as in Example B-1(2), a water-soluble salt was, respectively, added by the amount as shown in Table 3.

With respect to the fine polishing compositions for wafers thus obtained, the polishing tests of wafers were conducted in the same manner as in Example A-1(4) except that the relative speed of the polishing cloth to the wafer was changed to 1.2 m/sec.

Further, with respect to these fine polishing slurry compositions for wafers, the dispersion tests of the silica particles in the fine polishing compositions were conducted as follows.

The fine polishing slurry composition was put into a test tube having a height of 5 cm and a capacity of 100 cc and equipped with a stopper and left to stand still for one day. Then, the test tube was turned upside down and then to a normal position repeatedly until the silica particles were uniformly dispersed in the slurry as visually observed. The dispersibility was evaluated by the number of times of the operation until the uniform dispersion was obtained. The results are shown in Table 3.

TABLE 3

| Items | Examples | | | | Comparative Example |
|---|---|---|---|---|---|
| | C-1 | C-2 | C-3 | C-4 | C-1 |
| Particulate amorphous silica | | | | | |
| Type | Colloidal silica | Colloidal silica | Colloidal silica | Colloidal silica | Colloidal silica |
| Average particle size (mμm) | 70 | 70 | 70 | 70 | 70 |
| Content (wt %) in the composition | 2.0 | 2.0 | 2.0 | 2.0 | 2.0 |
| Polysaccharide polymer | | | | | |
| Type | Gua gum | Gua gum | Gua gum | Gua gum | Gua gum |

TABLE 3-continued

| Items | Examples C-1 | C-2 | C-3 | C-4 | Comparative Example C-1 |
|---|---|---|---|---|---|
| Graft monomer component | AM[*7] | AM | AM/AA[*8] | AM/AA | — |
| Process for preparation (Example) | A-1 | A-1 | B-1 | B-1 | |
| Content (ppm) in the composition[*6] | 200 | 200 | 75 | 75 | — |
| Alkaline substance, pH | | | | | |
| Type | Dimethyl amine | Dimethyl amine | Dimethyl amine | Dimethyl amine | Dimethyl amine |
| pH of the composition | 9–10 | 9–10 | 9–10 | 9–10 | 9–10 |
| Water-soluble salt | | | | | |
| Type | KCl | KCl | KCl | KCl | — |
| Content (wt %) in the composition | 0.01 | 0.1 | 0.01 | 0.1 | — |
| Fine polishing test of a wafer Polishing time (min) required to obtain a smooth surface | 3 | 1 | 3 | 1 | More than 20 |
| Test for dispersibility of silica particles in the composition (times) | | 5 | | | 100 |

[*6] The content is expressed by the concentration of gua gum.
[*7] AM means acrylamide.
[*8] AA means acrylic acid.

From Table 3, it is evident that the fine polishing compositions according to the second aspect of the present invention, the dispersibility of silica in the compositions is excellent.

I claim:

1. An aqueous based, slurried, fine polishing composition for wafers, comprising:
   a water medium containing at least 0.1% by weight particulate amorphous silica having an average particle size within the range of from 5 m$\mu$m to 10 $\mu$m and a polysaccharide polymer graft-polymerized with acrylamide alone or together with at least one vinyl monomer selected from the group consisting of acrylic acid, methacrylic acid and styrenesulfonic acid in a concentration of from 1 ppm to 1000 ppm, said aqueous composition being adjusted with an alkaline substance to a pH of from 8 to 12.

2. An aqueous based, fine polishing composition for wafers, comprising:
   a water medium containing at least 0.1% by weight particulate amorphous silica having an average particle size within the range of from 5 m$\mu$m to 10 $\mu$m and a polysaccharide polymer graft-polymerized with acrylamide alone or together with at least one vinyl monomer selected from the group consisting of acrylic acid, methacrylic acid and styrenesulfonic acid in a concentration of from 1 ppm to 1000 ppm, and a water-soluble salt, said aqueous composition being adjusted with an alkaline substance to a pH of from 8 to 12.

3. The fine polishing composition according to claim 2, wherein the amount of said water-soluble salt is at least 20 ppm in the aqueous medium.

4. The fine polishing composition according to claim 1, wherein the amount of said particulate amorphous silica is 2 wt %.

5. The fine polishing composition according to claim 1, wherein the maximum amount of said particulate amorphous silica is an amount which still maintains a slurry.

6. The fine polishing composition according to claim 1, wherein the polysaccharide polymer is at least one member selected from the group consisting of water-soluble gua gum and xanthane gum.

7. The fine polishing composition according to claim 1, wherein the alkaline substance is an alkali metal hydroxide, an amine or ammonia.

8. The fine polishing composition according to claim 2, wherein the water-soluble salt is at least one compound composed of a combination of a cation selected from the group consisting of lithium ion, sodium ion, potassium ion, cesium ion and ammonium ion and an anion selected from the group consisting of fluorine ion, chlorine ion, bromine ion, iodine ion, sulfuric acid ion, nitric acid ion, perchloric acid ion, carbonic acid ion, formic acid ion, acetic acid ion, acrylic acid ion and oxalic acid ion.

* * * * *